United States Patent
Kaneda

(10) Patent No.: US 7,675,784 B2
(45) Date of Patent: Mar. 9, 2010

(54) SEMICONDUCTOR MEMORY DEVICE WITH DUMMY BIT LINES FOR CHARGE AND DISCHARGE TIMING

(75) Inventor: Yoshinobu Kaneda, Gunma (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 180 days.

(21) Appl. No.: 11/948,715

(22) Filed: Nov. 30, 2007

(65) Prior Publication Data
US 2008/0130369 A1      Jun. 5, 2008

(30) Foreign Application Priority Data
Nov. 30, 2006   (JP)   ............... 2006-323023

(51) Int. Cl.
G11C 11/34      (2006.01)
G11C 16/06      (2006.01)

(52) U.S. Cl. .............. 365/185.25; 365/185.2; 365/185.21; 365/203; 365/204

(58) Field of Classification Search ............ 365/203, 365/204, 185.25, 185.21, 185.2
See application file for complete search history.

(56) References Cited

U.S. PATENT DOCUMENTS

| | | | | |
|---|---|---|---|---|
| 5,245,584 A | * | 9/1993 | Zampaglione et al. | 365/230.06 |
| 5,325,337 A | * | 6/1994 | Buttar | 365/203 |
| 5,602,788 A | * | 2/1997 | Barry et al. | 365/207 |
| 6,690,608 B2 | | 2/2004 | Nii et al. | |
| 6,738,296 B2 | * | 5/2004 | Sung et al. | 365/189.07 |
| 2005/0122812 A1 | * | 6/2005 | Song | 365/205 |

FOREIGN PATENT DOCUMENTS

| | | |
|---|---|---|
| JP | 2000-173278 A | 6/2000 |
| KR | 2003-85469 | 11/2003 |

* cited by examiner

*Primary Examiner*—Tuan T Nguyen
*Assistant Examiner*—R Lance Reidlinger
(74) *Attorney, Agent, or Firm*—Morrison & Foerster LLP

(57) ABSTRACT

The invention provides a semiconductor memory device which realizes high speed reading by automatically adjusting and optimizing charge and discharge timings even when a change in an operation environment such as a variation in an operation voltage, an operation temperature, a process parameter and so on occurs. First and second dummy bit lines are provided for a bit line, each having a wiring load twice the wiring load of the bit line. A first sense circuit sensing the voltage of the first dummy bit line is provided to control a charging time according to a first sense signal. A second sense circuit sensing the voltage of the second dummy bit line is further provided to control a discharging time according to a second sense signal. A sense amplifier sensing the voltage of the bit line is activated in response to the second sense signal.

7 Claims, 4 Drawing Sheets

SEMICONDUCTOR MEMORY DEVICE WITH DUMMY BIT LINES FOR CHARGE AND DISCHARGE TIMING

CROSS-REFERENCE OF THE INVENTION

This application claims priority from Japanese Patent Application No. 2006-323023, the content of which is incorporated herein by reference in its entirety.

BACKGROUND OF THE INVENTION

1. Field of the Invention

The invention relates to a semiconductor memory device, particularly, a semiconductor memory device which reads out data stored in a memory cell transistor by charging a bit line connected to the memory cell transistor and then discharging the bit line according to the data stored in the memory cell transistor.

2. Description of the Related Art

Recently, the nonvolatile memory is used not only for consumer goods such as a mobile, a digital camera and the like but also for on-vehicle, aerial or medical equipments, an ID card and the like which require high reliability in data storage.

The EEPROM (Electronically Erasable and Programmable Read Only Memory) is known as a general nonvolatile memory. This stores binary or multivalued digital data depending on whether or not a predetermined charge amount is accumulated in a floating gate and reads the digital data by sensing the change of conduction of a channel according to this charge amount. This EEPROM includes a stacked gate type EEPROM having a structure where a floating gate and a control gate are sequentially stacked on a semiconductor substrate and a split gate type EEPROM having a structure where a floating gate and a control gate face a channel of a semiconductor substrate.

FIG. 3 is a cross-sectional view showing one memory cell transistor MT of the split gate type EEPROM. An n$^+$-type drain 102 and an n$^+$-type source 103 are formed on a front surface of a P-type semiconductor substrate 101 at a given distance from each other, and a channel 104 is formed therebetween. A floating gate 106 is formed on a portion of this channel 104 and a portion of this source 103 with a gate insulation film 105 being interposed therebetween. An insulation film 107 thicker than the gate insulation film 105 is formed on the floating gate 106.

A tunnel insulation film 108 is formed covering the side surface of the floating gate 106 and a portion of the upper surface of the thick insulation film 107. A control gate 109 is formed on the tunnel insulation film 108 and a portion of the channel 104.

The operation of the memory cell transistor MT having this structure is as follows. First, when data "0" is written, a predetermined voltage is applied to the control gate 109 and the source 103 (e.g. 0V to the P-type semiconductor substrate 101 and 2V to the control gate 109) and a high voltage (e.g. 10V) is applied to the source 103 to flow a current through the channel 104, and thereby channel hot electrons are injected into the floating gate 106 through the gate insulation film 105. The channel hot electrons injected into the floating gate 106 are held in the floating gate 106 as electric charge.

On the other hand, when the data "0" stored in the memory cell transistor MT is erased, the drain 102 and the source 103 are grounded and a predetermined high voltage (e.g. 13V) is applied to the control gate 109 to flow a Fowler-Nordheim tunneling current through the tunnel insulation film 108, and thereby electrons accumulated in the floating gate 106 are extracted to the control gate 109. By this erasing, the digital data stored in the memory cell transistor MT turns to "1".

When the data stored in the memory cell transistor MT is read out, a predetermined voltage is applied to the control gate 109 and the drain 102 (e.g. 3V to the control gate 109 and 1V to the drain 102). Then, a cell current Ic flows between the source and the drain according to the charge amount of electrons accumulated in the floating gate 106. When the data "0" is already written, the threshold of the memory cell transistor MT is high and thus the cell current Ic is usually about 0 µA. When the data "1" is already written, the threshold of the memory cell transistor MT is low and thus the cell current Ic is usually about 40 µA. The described technique is described in Japanese Patent Application Publication No. 2000-173278.

As a method of reading data, there are a current sensing method where data stored in a memory cell transistor is judged to be "0" or "1" by comparing a cell current Ic with a reference current Iref, and a voltage sensing method where data stored in a memory cell transistor is judged to be "0" or "1" by converting a cell current Ic into a voltage and comparing the voltage with a reference voltage Vref.

Hereafter, the structure of a read circuit with the voltage sensing method will be described referring to FIG. 4. A plurality of memory cell transistors shown in FIG. 3 is disposed into a matrix, forming a memory array 1. FIG. 4 shows only one memory cell transistor MT. The memory cell transistor MT is provided at an intersection of a bit line BL extending in the Y direction and a word line WL extending in the X direction, where a source 103 is connected to a source line SL extending in the X direction, a drain 102 is connected to the bit line BL, and a control gate 109 is connected to the word line WL.

A numeral 2 designates a sense amplifier comparing the voltage of the bit line BL and a reference voltage Vref (0<Vref<Vcc), which is activated by a sense enable signal SAENB from a read control circuit 3. A numeral 4 designates a precharge transistor precharging the bit line into H level (a supply voltage Vcc). The precharge transistor 4 is configured of a P-channel type MOS transistor, and a precharge enable signal PC from the read control circuit 3 is inputted to the gate thereof through an inverter 5.

The read control circuit 3 is configured of a circuit shown in FIG. 5 having a first delay circuit 31 delaying a read enable signal RDE, a second delay circuit 32 delaying the output of this first delay circuit 31, and an AND circuit 33 performing logical multiplication of the read enable signal RDE and an inverted signal of the output of the first delay circuit 31. Each of the first and second delay circuits 31 and 32 is configured of a resistor and a capacitor. The precharge enable signal PC is obtained from the output of the AND circuit 33, and the sense enable signal SAENB is obtained from the output of the second delay circuit 32.

The operation of this read circuit will be described referring to FIG. 6. When the word line WL turns to H level, the memory cell transistor MT is turned to a selected state. When the read enable signal RDE turns to H level, the precharge enable signal PC turns to H level and keeps it for a period t1. When the precharge enable signal PC turns to H level, the precharge transistor 4 turns on and the bit line BL is charged into H level.

Then, when a period t2 passes, the sense enable signal SAENB turns to H level and the sense amplifier 2 is activated. During this period t2, the data stored in the memory cell transistor MT is read out. In detail, the cell current Ic flows when the data stored in the memory cell transistor MT is "1", and the bit line BL is discharged into L level (a ground voltage Vss). In this case, the output of the sense amplifier 2 becomes L level. On the other hand, when the data stored in the memory cell transistor MT is "0", the cell current Ic hardly flows and thus the voltage of the bit line BL keeps H level. In this case, the output of the sense amplifier 2 becomes H level.

The period t1 is determined by the delay time of the first delay circuit 31, and the period t2 is determined by the delay time of the second delay circuit 32.

As described above, the bit line BL is charged and then discharged in the reading operation, and the periods t1 and t2 for charging and discharging (=the reading time) are set by the first delay circuit 31 and the second delay circuit 32, respectively. Therefore, in this read circuit, the periods t1 and t2 are set so that the reading operation can be performed in the worst operation environment taking account of variation in an operation voltage, an operation temperature, a process parameter and so on. This causes a problem that an unnecessary margin is required in the reading time under a condition which is not in the worst environment and thus a high speed reading operation is not achievable.

SUMMARY OF THE INVENTION

The invention is made for solving the above problem and the main feature thereof is as follows. The invention provides a semiconductor memory device including: a memory cell transistor; a bit line connected to the memory cell transistor; a sense amplifier activated by a sense enable signal and sensing a voltage of the bit line; a first dummy memory cell transistor; a first dummy bit line connected to the first dummy memory cell transistor and having a wiring load larger than a wiring load of the bit line; a first sense circuit sensing a voltage of the first dummy bit line and outputting a first sense signal; a precharge circuit charging the bit line and the first dummy bit line; a second dummy memory cell transistor; a second dummy bit line connected to the second dummy memory cell transistor and having a wiring load larger than the wiring load of the bit line; a discharge circuit discharging the bit line and the second dummy bit line; a second sense circuit sensing a voltage of the second dummy bit line and outputting a second sense signal; and a read control circuit starting a charging operation of the precharge circuit in response to a read enable signal, ending the charging operation of the precharge circuit and starting a discharging operation of the discharge circuit in response to the first sense signal of the first sense circuit, and outputting the sense enable signal in response to the second sense signal of the second sense circuit.

DETAILED DESCRIPTION OF THE INVENTION

Figure 1:
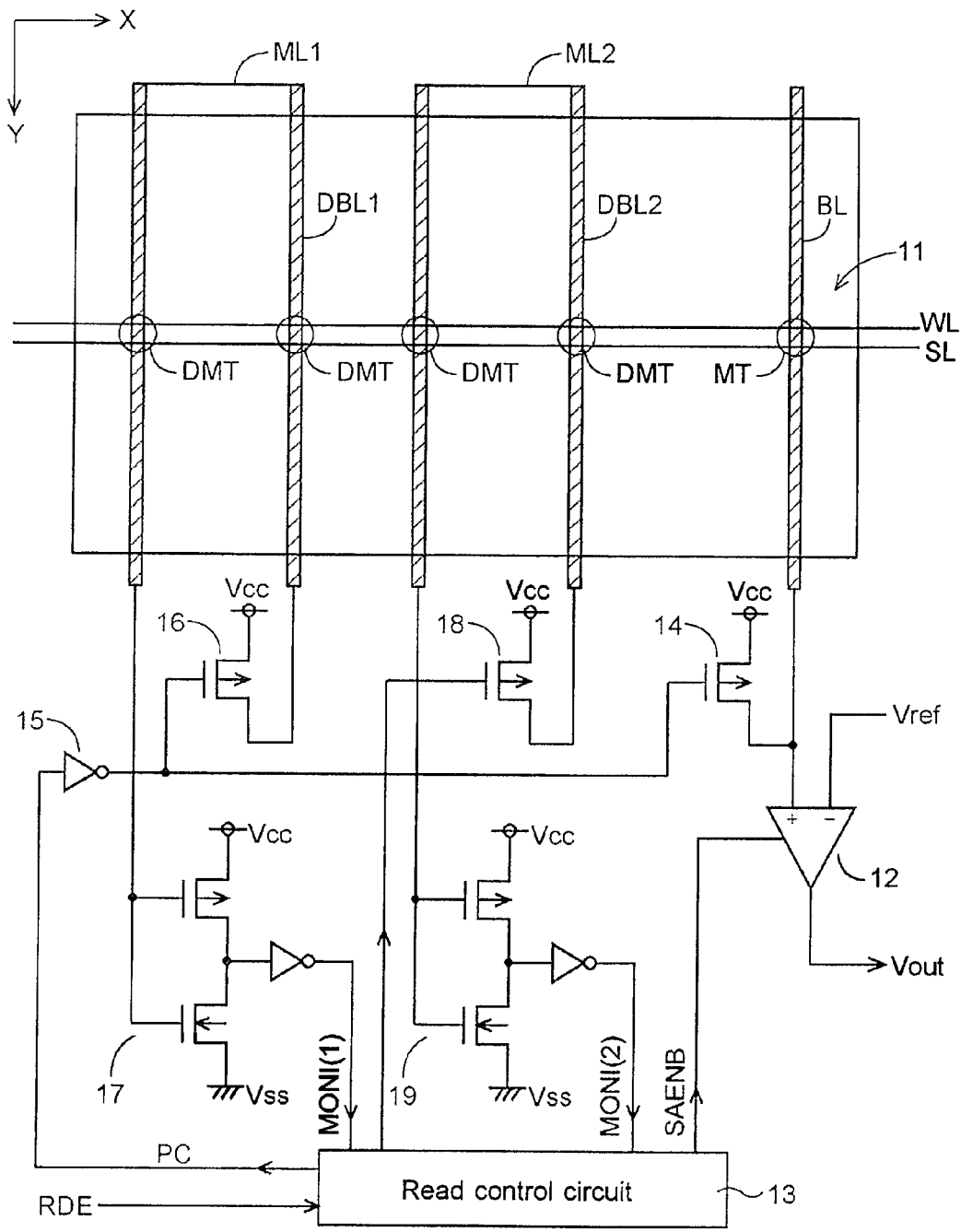
FIG. 1 is a circuit diagram of a semiconductor memory device of an embodiment of the invention.
Figure 3:
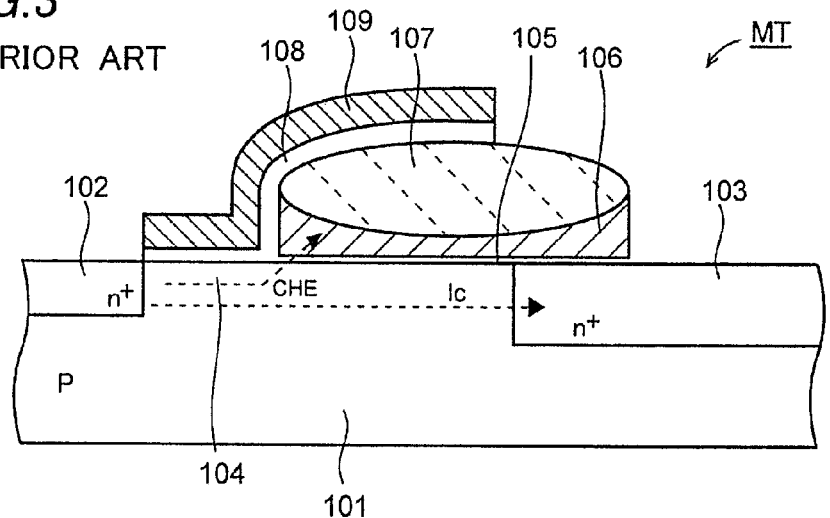
FIG. 3 is a cross-sectional view for explaining a memory cell of a split gate type EEPROM.
Figure 4:
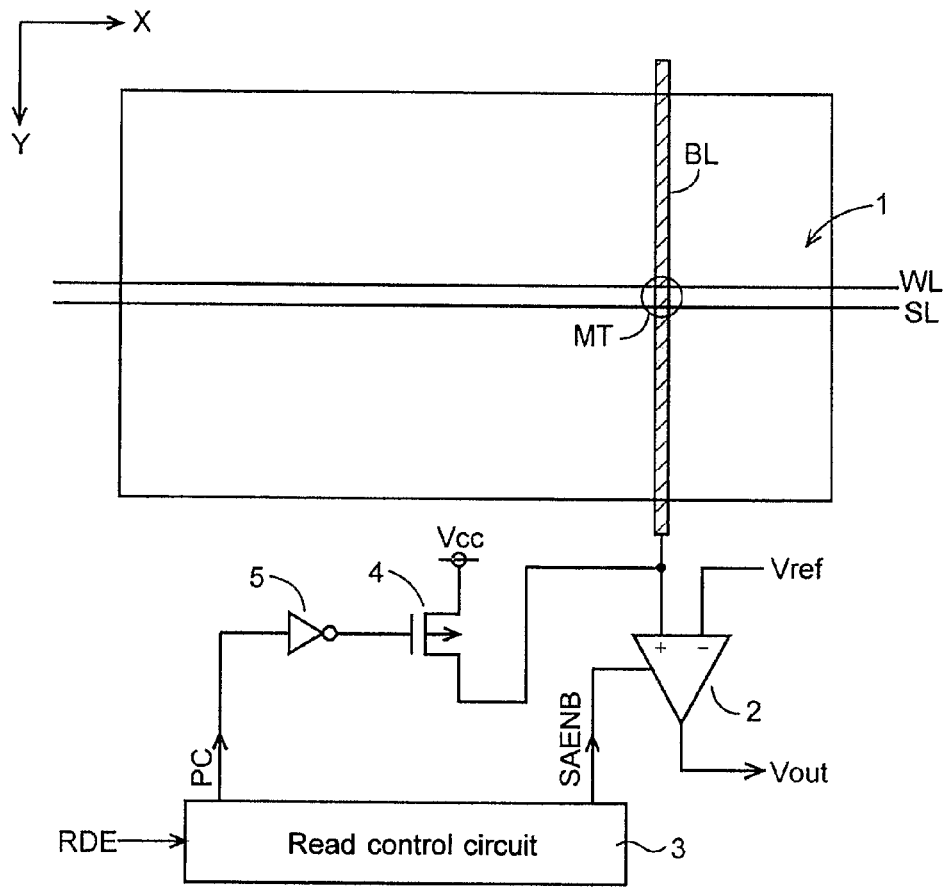
FIG. 4 is a circuit diagram of a conventional semiconductor memory device.
Figure 5:
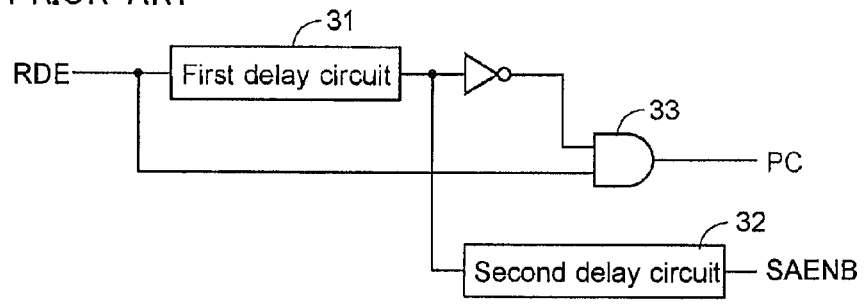
FIG. 5 is a circuit diagram of a read control circuit of FIG. 1.
Figure 6:
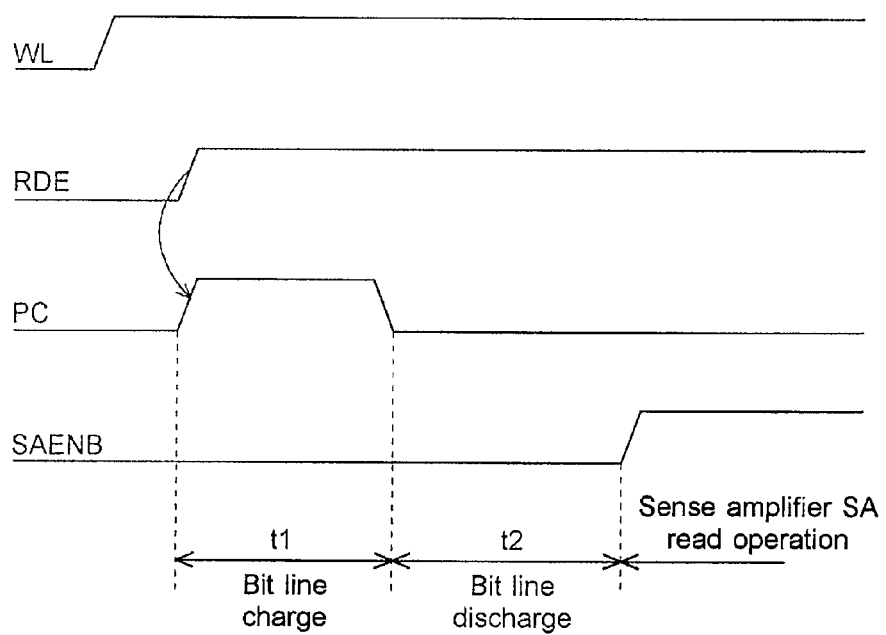
FIG. 6 is an operation timing chart of the conventional semiconductor memory device.

A semiconductor memory device of an embodiment of the invention will be described referring to figures. FIG. 1 is a circuit diagram of the semiconductor memory device of the invention. A plurality of memory cell transistors shown in FIG. 3 is disposed to form a matrix, forming a memory array 11. FIG. 1 shows only one memory cell transistor MT and four dummy memory cell transistors DMT for this transistor MT. The memory cell transistor MT is provided at an intersection of a bit line BL extending in the Y direction and a word line WL extending in the X direction, where a source 103 is connected to a source line SL extending in the X direction, a drain 102 is connected to the bit line BL, and a control gate 109 is connected to the word line WL.

A numeral 12 designates a sense amplifier comparing the voltage of the bit line BL and a reference voltage Vref (0<Vref<Vcc), which is activated by a H level sense enable signal SAENB from a read control circuit 13. A numeral 14 designates a precharge transistor charging the bit line BL into H level (a supply voltage Vcc). The precharge transistor 14 is configured of a P-channel type MOS transistor, and a precharge enable signal PC from the read control circuit 13 is inputted to the gate thereof through an inverter 15.

A first dummy bit line DBL1 extending in the Y direction is provided. This first dummy bit line DBL1 is provided for sensing the charge of the bit line BL, and configured of two bit lines BL serially connected with wiring ML1. Two dummy memory cell transistors DMT each having the same structure as that of the memory cell transistor MT are provided at the intersections of the word line WL and the first dummy bit line DBL1. In the dummy memory cell transistor DMT, in the similar manner to the memory cell transistor MT, a source 103 is connected to the source line SL, a drain 102 is connected to the bit line BL, and a control gate 109 is connected to the word line WL.

A precharge transistor 16 is connected to the first dummy bit line DBL1, like for the bit line BL. A first sense circuit 17 sensing the voltage of the first dummy bit line DBL1 is further provided. The first sense circuit 17 is configured of a two-stage CMOS inverter.

A first sense signal MONI(1) is obtained from the first sense circuit 17. The first sense signal MONI(1) is a signal of sensing the completion of the charge of the bit line BL into H level (the supply voltage Vcc). In detail, the bit line BL and the first dummy bit line DBL1 are simultaneously charged. The first dummy bit line DBL1 has a wiring load twice the load of the bit line BL, and this means that the bit line BL completes its charge into Vcc at the time when the voltage of the first dummy bit line DBL1 increases to ½ Vcc. Therefore, by setting the threshold of the first-stage CMOS inverter of the first sense circuit 17 at ½ Vcc, the sensing of the bit line BL charged to Vcc is realized. For directly sensing the bit line BL reaching Vcc, it is necessary to form a sense circuit with a resistor dividing circuit, an activation amplifier and so on, causing a complex structure and a low sensing speed. However, since the bit line BL charged to Vcc is sensed by sensing ½ Vcc in the invention, the sense circuit may be configured of a simple CMOS inverter and thus has a high sensing speed and very small size.

A second dummy bit line DBL2 extending in the Y direction is further provided. This second dummy bit line DBL2 is provided for sensing the discharge of the bit line BL, and is configured of two bit lines BL serially connected with wiring ML2. Two dummy memory cell transistors DMT each having the same structure as that of the memory cell transistor MT are provided at the intersections of the word line WL and the second dummy bit line DBL2. In the dummy memory cell transistor DMT, in the similar manner to the memory cell transistor MT, a source 103 is connected to the source line SL, a drain 102 is connected to the bit line BL, and a control gate 109 is connected to the word line WL.

A precharge transistor 18 is connected to the second dummy bit line DBL2. The precharge transistor 18 completes the charge of the second dummy bit line BL2 into Vcc before the charge completion of the first dummy bit line BL1. Then, the precharge transistor 18 turns off in response to the first sense signal MONI(1) sensing the charge of the bit line BL. The data "1" is stored in the two dummy memory cell transistors DMT in advance. Therefore, the discharge of the second dummy bit line DBL2 is started. In the case where the data "1" is stored in the memory cell transistor MT connected to the bit line BL, the discharge of the bit line BL and the discharge of the second dummy bit line DBL2 are simultaneously started.

A second sense circuit 19 sensing the voltage of the second dummy bit line DBL2 is further provided. The second sense circuit 19 is also configured of a two-stage CMOS inverter, like the first sense circuit 17. The threshold of the first-stage CMOS inverter of the second sense circuit 19 is set to ½ Vcc. The second dummy bit line DBL2 has a wiring load twice the wiring load of the bit line BL, and this means that the bit line BL reaches the L level (the ground voltage Vss) and completes the discharge at the time when the voltage of the second dummy bit line DBL2 lowers to ½ Vcc. Therefore, the completion of the discharge of the bit line BL (the completion of the reading out of the data "1" to the bit line BL) is sensed by the second sense circuit 19.

Figure 2:
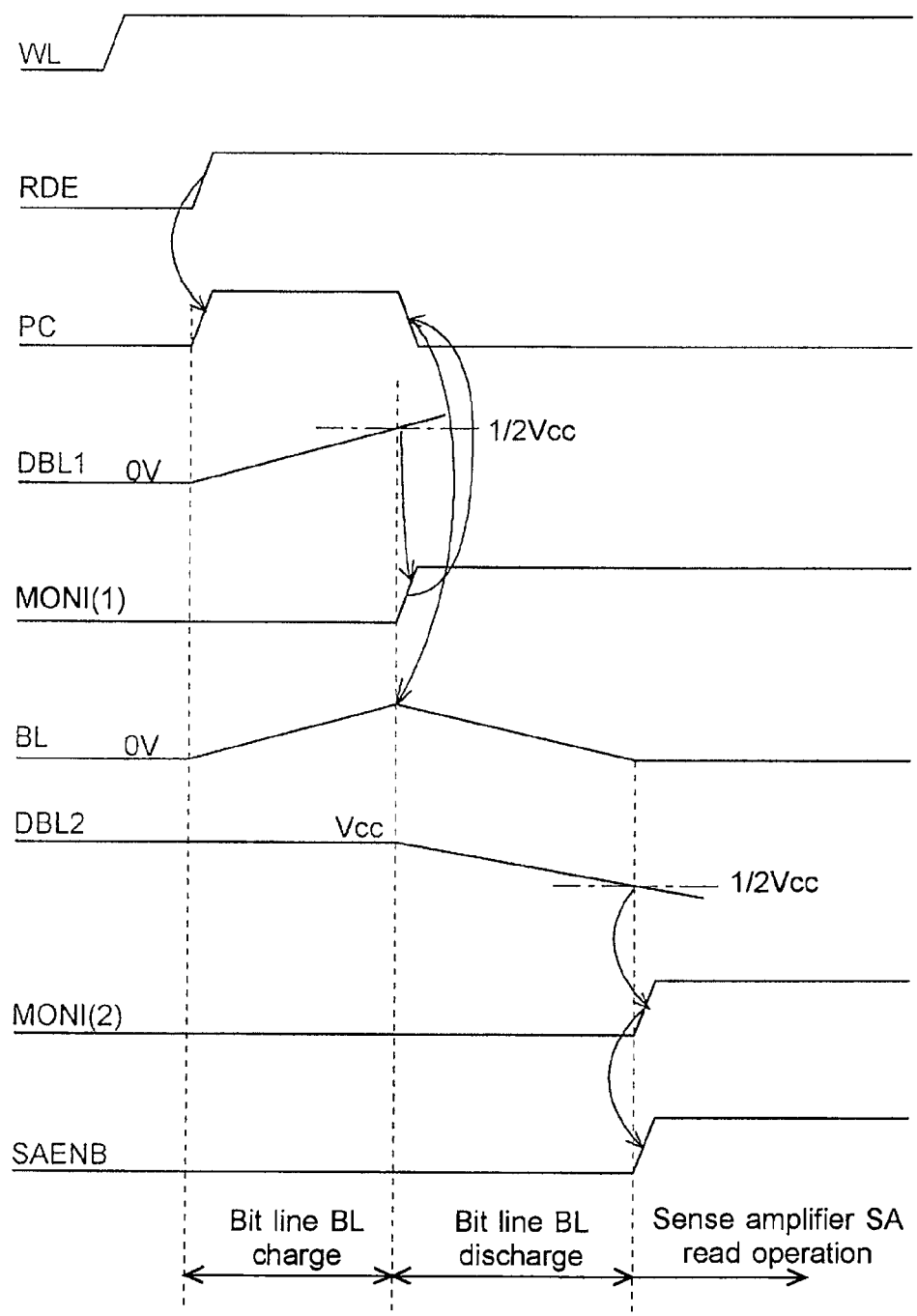
FIG. 2 is an operation timing chart of the semiconductor memory device of the embodiment of the invention.

The operation of the above-described read circuit will be described referring to FIG. 2. When the word line WL turns to H level, the memory cell transistor MT is turned to a selected state. Suppose that the bit line BL and the first dummy bit line DBL1 are set to L level (the ground voltage Vss) and the second dummy bit line DBL2 is set to H level (the supply voltage Vcc) in the initial state. Then, when the read enable signal RDE turns to H level, the precharge enable signal PC turns to H level. When the precharge enable signal PC turns to H level, the precharge transistors 14 and 16 turn on and the charge of the bit line BL and the charge of the first dummy bit line DBL1 are started. Then, when the first dummy bit line DBL1 reaches 1/2 Vcc, the first sense signal MONI(1) turns to H level, and, in response to this, the precharge enable signal PC is turned to L level by the read control circuit 13. Therefore, the precharge transistors 14 and 16 turn off, completing the precharge of the bit line BL.

Then, in the case where the data "1" is stored in the memory cell transistor MT, the discharge of the bit line BL is started with the cell current Ic flowing through the memory cell transistor MT. Furthermore, since the read control circuit 13 turns off the precharge transistor 18 in response to the first sense signal MONI(1) turning on, the discharge of the second dummy bit line BL2 is simultaneously started with the cell current Ic flowing through the dummy memory cell transistor DMT.

Then, when the second dummy bit line DBL2 lowers to ½ Vcc, the second sense signal MONI(2) turns to H level. In response to this, the read control circuit 13 outputs the H level sense enable signal SAENB to the sense amplifier 12. Therefore, the sense amplifier 12 is activated and the data is read out by comparing the potential of the bit line BL and the reference voltage Vref. In the case where the data "0" is stored in the memory cell transistor MT, a current hardly flows through the memory cell transistor MT, so that the voltage of the bit line BL keeps Vcc.

As described above, with the above-described circuit, the timings of charging and discharging the bit line BL are automatically adjusted by sensing the voltages of the first and second dummy bit lines DBL1 and DBL2 even if a change in an operation environment such as a variation in an operation voltage (Vcc), an operation temperature, a process parameter and so on occurs. This eliminates an unnecessary operation margin and realizes high speed reading.

Although each of the first and second dummy bit lines DBL1 and DBL2 is configured of serially-connected two usual bit lines BL in the above-described circuit, it may be configured of serially-connected three or more bit lines BL. In this case, the thresholds of the CMOS inverters of the first and second sense circuits 17 and 19 need be adjusted.

Furthermore, although the discharging time of the second dummy bit line DBL2 is recognized with the second sense signal MONI(2) of the second sense circuit 19 in the above-described circuit, this second sense signal MONI(2) may be used to adjust the voltage of the word line WL when data is read out. In detail, the memory cell transistor MT is degraded by repeating data writing and erasing many times, causing a problem of reducing the cell current Ic when data is erased (data "1") and discharging the bit line BL insufficiently. For solving this, when the discharging time becomes longer than a given time, based on the second sense signal MONI(2), the read control circuit 13 changes the voltage of the word line WL when data is read out into a higher value to increase the cell current Ic. This realizes reduction in the discharging time (the reading time).

The semiconductor memory device of this embodiment automatically adjusts and optimizes the charging and discharging timings even if a change in an operation environment such as a variation in an operation voltage, an operation temperature, a process parameter and so on occurs. This eliminates an unnecessary operation margin and realizes high speed reading.

What is claimed is:

1. A semiconductor memory device comprising:
    a memory cell transistor;
    a bit line connected to the memory cell transistor;
    a sense amplifier activated by a sense enable signal and sensing a voltage of the bit line;
    a first dummy memory cell transistor;
    a first dummy bit line connected to the first dummy memory cell transistor and having a wiring load larger than a wiring load of the bit line;
    a first sense circuit sensing a voltage of the first dummy bit line and outputting a first sense signal;
    a precharge circuit charging the bit line and the first dummy bit line;
    a second dummy memory cell transistor;
    a second dummy bit line connected to the second dummy memory cell transistor and having a wiring load larger than the wiring load of the bit line;
    a discharge circuit discharging the bit line and the second dummy bit line;
    a second sense circuit sensing a voltage of the second dummy bit line and outputting a second sense signal; and
    a read control circuit starting a charging operation of the precharge circuit in response to a read enable signal, ending the charging operation of the precharge circuit and starting a discharging operation of the discharge circuit in response to the first sense signal of the first sense circuit, and outputting the sense enable signal in response to the second sense signal of the second sense circuit, wherein the first dummy memory cell transistor is connected to only one dummy bit line, and the second dummy memory cell transistor is connected to only one dummy bit line.

2. The semiconductor memory device of claim 1, wherein each of the first and second dummy bit lines comprises a plurality of bit lines connected in serial.

3. The semiconductor memory device of claim 1, wherein each of the first and second sense circuits comprises an inverter.

4. The semiconductor memory device of claim 2, wherein each of the first and second sense circuits comprises an inverter.

5. The semiconductor memory device of claim 1, wherein the read control circuit adjusts a voltage of a word line connected to the memory cell transistor when data is read out from the memory cell transistor, based on the second sense signal.

6. The semiconductor memory device of claim 1, wherein each of the first and second dummy bit lines comprises two bit lines connected in serial, and a column of a memory array of the memory device corresponding to each of the four bit lines includes a dummy memory cell transistor.

7. The semiconductor memory device of claim 1, wherein all dummy memory cell transistors connected to the second dummy bit line store the same bit data.

* * * * *